(12) United States Patent
Kim et al.

(10) Patent No.: US 7,224,055 B2
(45) Date of Patent: May 29, 2007

(54) CENTER PAD TYPE IC CHIP WITH JUMPERS, METHOD OF PROCESSING THE SAME AND MULTI CHIP PACKAGE

(75) Inventors: Gu-Sung Kim, Kyungki-do (KR); Dong-Hyeon Jang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/269,328

(22) Filed: Oct. 10, 2002

(65) Prior Publication Data
US 2003/0094684 A1    May 22, 2003

(30) Foreign Application Priority Data
Nov. 20, 2001    (KR) ................. 2001-72348

(51) Int. Cl.
*H01L 23/02* (2006.01)
(52) U.S. Cl. .................................... 257/686
(58) Field of Classification Search ............. 257/686, 257/777, 734–738, 689–692; 361/790
See application file for complete search history.

(56) References Cited

U.S. PATENT DOCUMENTS

| | | | |
|---|---|---|---|
| 6,140,149 A | 10/2000 | Wark | |
| 6,175,159 B1* | 1/2001 | Sasaki | .......................... 257/778 |
| 6,583,511 B2* | 6/2003 | Michii et al. | ................ 257/777 |
| 2002/0053727 A1* | 5/2002 | Kimura | ....................... 257/686 |
| 2002/0121695 A1* | 9/2002 | Stephenson et al. | ........ 257/738 |
| 2003/0057570 A1* | 3/2003 | Ball | ........................... 257/786 |
| 2004/0262757 A1* | 12/2004 | Kinsman et al. | ............ 257/738 |

FOREIGN PATENT DOCUMENTS

| | | |
|---|---|---|
| JP | 10-256293 | 9/1998 |
| JP | 11-260851 | 9/1999 |
| JP | 11-040743 | 12/1999 |
| KR | 1020000003753 | 1/2000 |
| KR | 1020010026512 | 4/2001 |

OTHER PUBLICATIONS

English language abstract for Korean Publication No. 1020000003753.
English language abstract for Korean Publication No. 1020010026512.
English language abstract for Japan Publication No. 10-256293.
English language abstract for Japan Publication No. 11-260851.
English language abstract for Japan Publication No. 11-040743.

* cited by examiner

*Primary Examiner*—Nathan W. Ha
(74) *Attorney, Agent, or Firm*—Marger Johnson & McCollom, P.C.

(57) ABSTRACT

A center pad type integrated circuit chip and a method of forming the same is presented. The chip comprises an integrated circuit chip having chip pads formed on a center region thereof and a jumper. The jumper includes a buffer layer arranged adjacent to a side of the chip pads and a plurality of jump metal lines formed on the buffer layer. The jump metal lines are spaced apart from each other.

20 Claims, 14 Drawing Sheets

CENTER PAD TYPE IC CHIP WITH JUMPERS, METHOD OF PROCESSING THE SAME AND MULTI CHIP PACKAGE

This application relies for priority upon Korean Patent Application No. 2001-72348, filed on Nov. 20, 2001, the contents of which are herein incorporated by reference in their entirety.

TECHNICAL FIELD OF THE INVENTION

The present invention relates to a semiconductor device and, more particularly, to a center pad type integrated circuit (IC) chip, a method of manufacturing the same, and a multi chip package.

BACKGROUND OF THE INVENTION

Recent trends in electronics have been towards miniaturization, reduced weight, and multifunctionality. In order to satisfy these pressing demands, multi chip packaging technology has been developed. The technology incorporates a plurality of IC chips of the same type or different type in a single package. The multi chip packaging technology is advantageous in terms of size, weight and mounting density as compared to the case where only one IC chip is mounted in the single package so that a plurality of packages is required for mounting the plurality of IC chips. In the conventional multi chip packaging technology, two IC chips of same type or different type are attached to the board in turn, and IC chips and the board are electrically connected using a wire-bonding method. The conventional multi chip packaging technology will be described below with reference to FIGS. 1 to 3.

Figure 1:
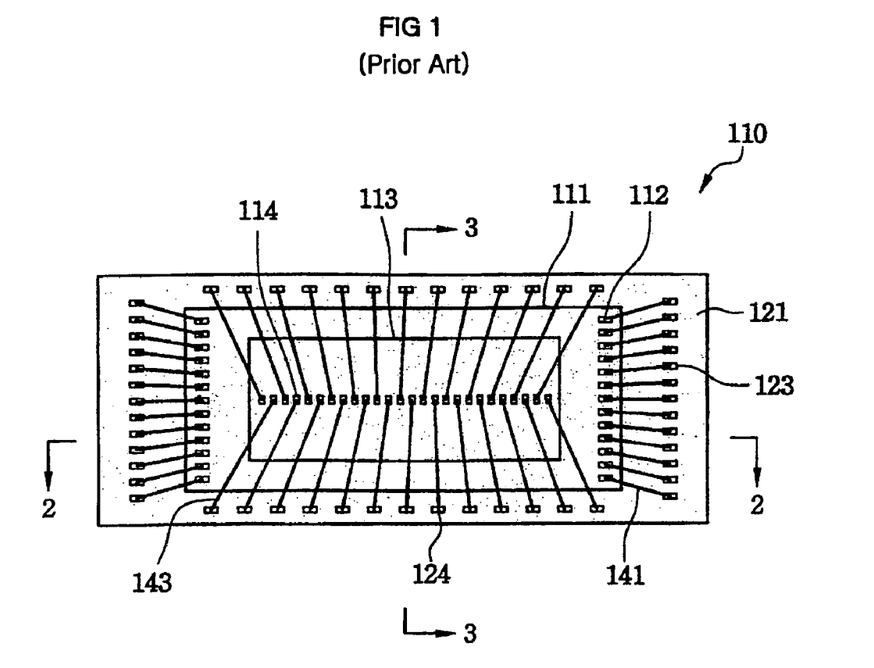
FIG. 1 is a plan view of the package before encapsulation in accordance with one example of the conventional multi chip package.
Figure 2:
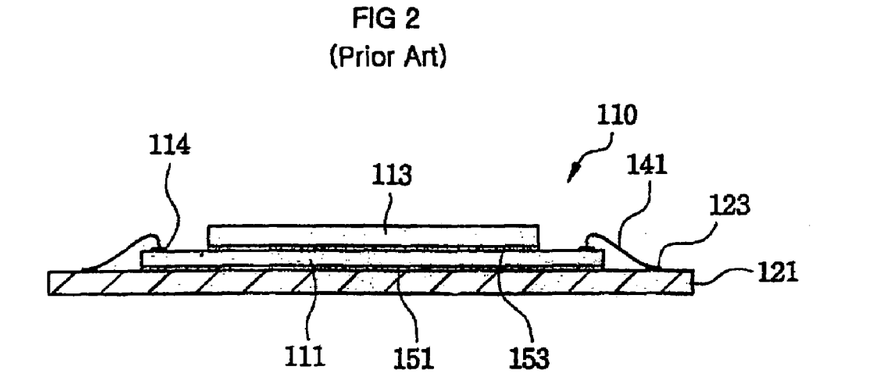
FIG. 2 is a cross sectional view taken along line 2—2 of FIG. 1.
Figure 3:
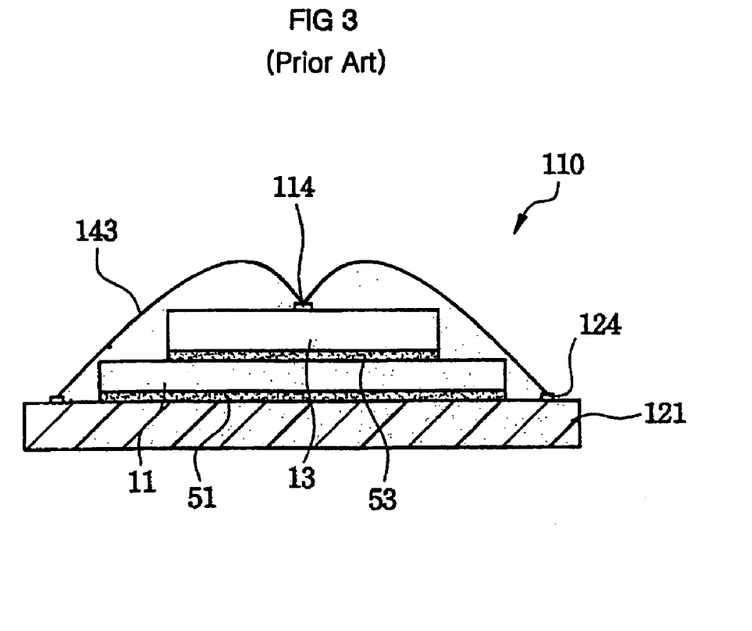
FIG. 3 is a cross sectional view taken along line 3—3 of FIG. 1.

FIG. 1 is a plan view of a package before encapsulation in accordance with one example of a conventional multi chip package; FIG. 2 is a cross sectional view taken along line 2—2 of FIG. 1; FIG. 3 is a cross sectional view taken along line 3—3 of FIG. 1.

As shown in FIGS. 1 through 3, the conventional multi chip package 110 includes a first IC chip 111 having chip pads 112 along two edges of the chip and a second IC chip 113 having a row of chip pads 114 along the center of the chip. The first chip 111 is attached to the board 121 with an adhesive 151 and the second chip 113 is attached to the first chip 111 with an adhesive 153. The active surfaces of chips 111 and 113, on which the integrated circuits are formed, face the same direction. The first chip 111 and second chip 113 are electrically connected to the board 121 by wire-bonding chip pads 112 and 114 to the corresponding board pads 123 using bonding wires 141 and 143. Since the chip pads 114 of the second chip 113 are far from the board pads 123, the bonding wires 143 of the second chip 113 have long loops. As a result, problems such as cutting, sagging, and short-circuit of the bonding wires 143 are prevalent.

As an alternative method for solving the above problems, pad redistribution methods or the use of special bonding wires has been proposed. With the pad redistribution method, the chip pads of the second chip 113 are moved from the center to the edge of the chip. However, because this method requires many additional processes to form several more layers on the chip, the processing cost and time increase. Furthermore, the density of devices on the chip decreases because the pad redistribution method requires separate processes based on the IC chip and wafer sizes. For example, in the case where special gold (Au) bonding wires coated with a polymer material is used, the cost of the bonding wires is much more expensive and the manufacturing cost of the package is greatly increased.

As another alternative, a method used in ceramic packaging can be adopted. That is, a separate IC chip or jumper chip is attached to the board around the second chip. More specifically, by wire bonding the second chip to the jumper chip and then wire bonding the jumper chip to the board, the bonding wires of the second chip no longer have long fragile loops. However, because the number of jumper chips required is equal to the number of bonding wires, there are many drawbacks in terms of size, weight and manufacturing cost.

SUMMARY OF THE INVENTION

Accordingly, the present invention provides a center pad type IC chip having a jumper, a method of manufacturing the same, and a multi chip package capable of solving problems caused by long loops of bonding wires without many additional processes and greatly increasing the manufacturing cost.

A center pad type integrated circuit chip comprises an integrated circuit chip having chip pads formed on a center region thereof and a jumper. The jumper includes a buffer layer arranged adjacent to a side of the chip pads and a plurality of jump metal lines formed on the buffer layer. The jump metal lines are spaced apart from each other.

With the descriptions mentioned above along with other feature and advantages, the outline will be more clearly understood from the following detailed description taken in conjunction with the accompanying illustrations. It is important to point out that the illustrations may not necessarily be drawn to scale and there may be other embodiments to this invention that are not specifically illustrated.

BRIEF DESCRIPTION OF THE DRAWINGS

These and other objects, features and advantages of the present invention will be readily understood with reference to the following detailed description thereof provided in conjunction with the accompanying drawings, wherein like reference numerals designate like structural elements, and, in which.

DETAILED DESCRIPTION OF PREFERRED EMBODIMENTS

Preferred embodiments of the invention will be described below with reference to the accompanying drawings.

Figure 4:
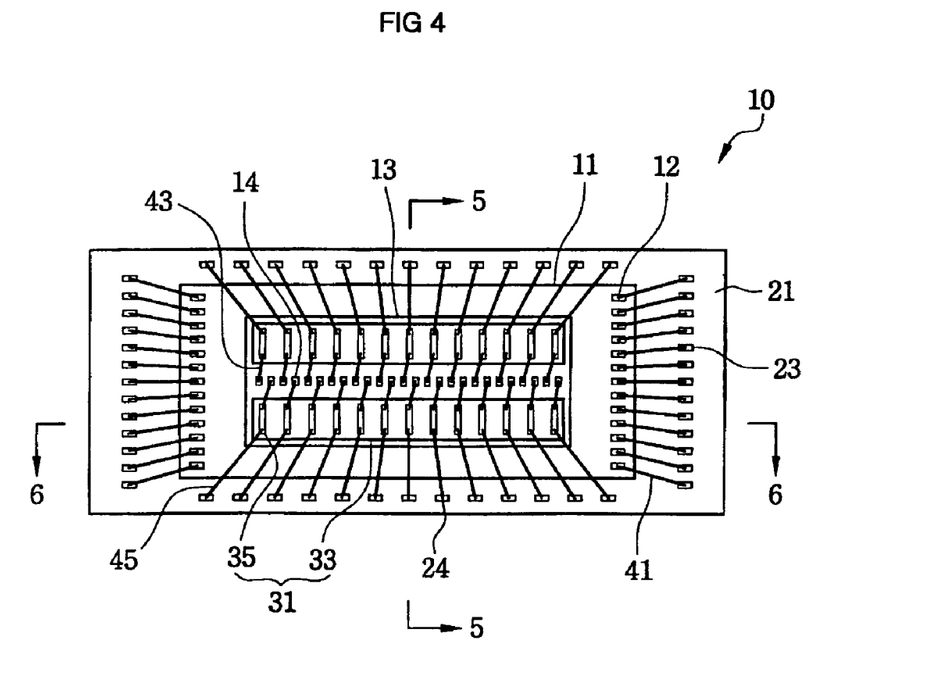
FIG. 4 is a plan view of the multi chip package before encapsulation in accordance with an embodiment of the present invention.
Figure 5:
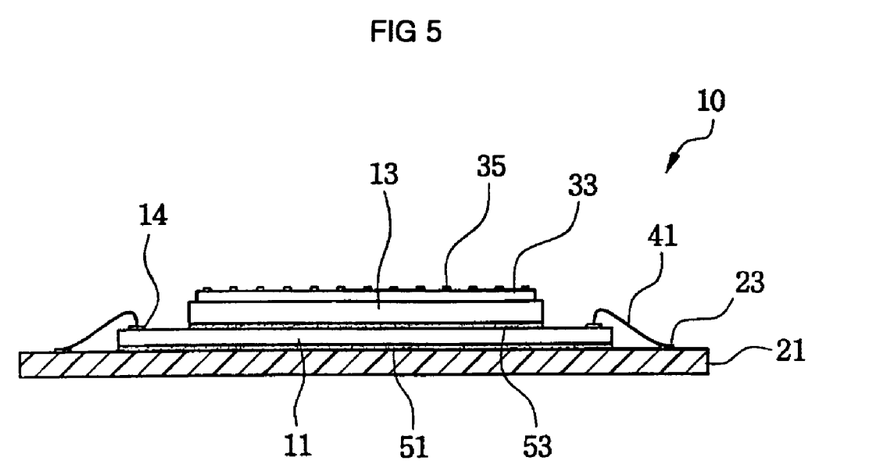
FIG. 5 is a cross sectional view taken along line 6—6 of FIG. 4.
Figure 6:
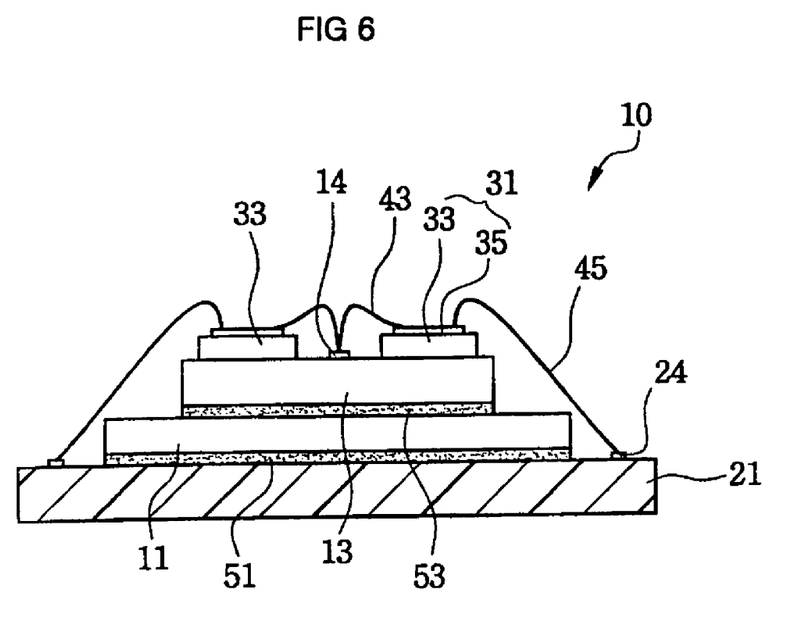
FIG. 6 is a cross sectional view taken along line 5—5 of FIG. 4.

FIG. 4 is a plan view of a multi chip package before encapsulation in accordance with an embodiment of the present invention; FIG. 5 is a cross sectional view taken along line 6—6 of FIG. 4; FIG. 6 is a cross sectional view taken along line 5—5 of FIG. 4.

Referring to FIGS. 4 through 6, the multi chip package 100 in accordance with an embodiment of the present invention includes a first IC chip 11, a second IC chip 13 and a board 21 for mounting the chips 11, 13. The board 21 has a chip mounting area substantially at the center and board pads 23 at four edges. A tape circuit board or a printed circuit board may be used for the board 21.

The first chip 11 is attached to the chip mounting area with an adhesive 51. The first chip 11 is an edge pad type in which chip pads 12 are formed on opposites sides of the active surface thereof. Integrated circuits are formed in the active surface. The surface opposite the active surface of the first chip 11 is a non-active surface used for attachment to the board 21.

The second chip 13 is attached to the first chip 11 with an adhesive 53. The second chip 13 is a center pad type in which chip pads 14 are formed substantially at the center of the active surface. The second chip 13 is smaller than the first chip 11. The chip pads 14 of the second chip 13 are arranged perpendicularly to the rows of the chip pads of the first chip 11. The second chip 13 can have various sizes and shapes as long as the chip pads 12 of the first chip 11 are exposed. The non-active surface of the second chip 13 is used for attachment to the first chip 11.

Jumpers 31 are formed at both edges of the chip pads 14 of the second chip 13. The jumpers 31 have a buffer layer 33 on the active surface and jump metal lines 35 on the buffer layer 33. The buffer layer 33 is made of an insulation material such as polyimide. The jump metal lines 35 have a predetermined pitch and pattern so that one side of the jump metal line 35 is adjacent the chip pads 14 at the center of the second chip 13 and other side is adjacent to edge of the second chip 13. The jump metal line 35 comprises a metal having excellent electric conductivity, such as gold (Au), aluminum (Al), or palladium (Pd).

The first chip 11 is directly connected to the board 21 via bonding wires, while the second chip 13 is indirectly connected to the board 21 via bonding wires attached to the jumpers 31. Specifically, the first chip 11 is electrically connected to the board 21 by wire-bonding the chip pads 12 of the first chip 11 to the corresponding board pads 23 via first bonding wires 41. The second chip 13 is electrically connected to the board 21 by the following process. That is, the chip pads 14 of the second chip 13 are wire-bonded to the corresponding sides of jump metal lines 35 adjacent the chip pads 14 via second bonding wires 43, and then the other sides of jump metal lines 35 adjacent the edge of the second chip 13 are wire-bonded to the corresponding board pads 23 via jump bonding wires 45.

The multi chip package of an embodiment of the present invention can be a BGA (ball grid array) package having solder balls as external connections, or a TCP (tape carrier package).

As described above, the problems caused by long loops can be solved by including the jumper in the multi chip package according to an embodiment of the present invention. Although the jump metal lines of the jumper have a predetermined pitch and pattern in this embodiment, the pitch and pattern of the jump metal line may be changed, if necessary. Furthermore, the jumper can be formed at the chip or wafer level. Hereinafter, the jumper will be described.

First, jumpers formed at the wafer level are described below in reference to FIGS. 7 and 8.

FIGS. 7A to 7D illustrate a sputtering process used in the manufacture of the center pad type IC chip in accordance with an embodiment of the present invention. FIGS. 8A and 8B illustrate a laser-milling process used in the manufacture of the center pad type IC chip in accordance with another embodiment of the present invention.

Figure 7A:
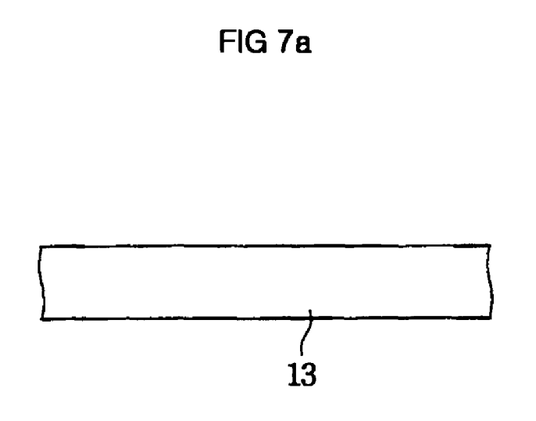
FIGS. 7A to 7D illustrates the sputtering method employed in manufacturing a center pad type IC chip in accordance with an embodiment of the present invention.
Figure 7B:
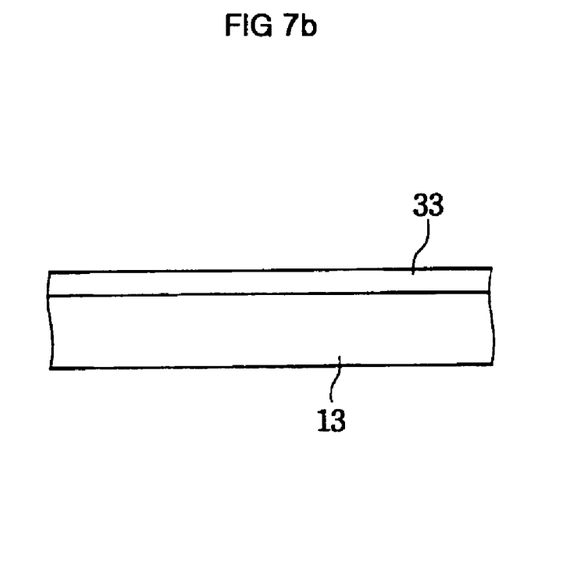
Figure 7C:
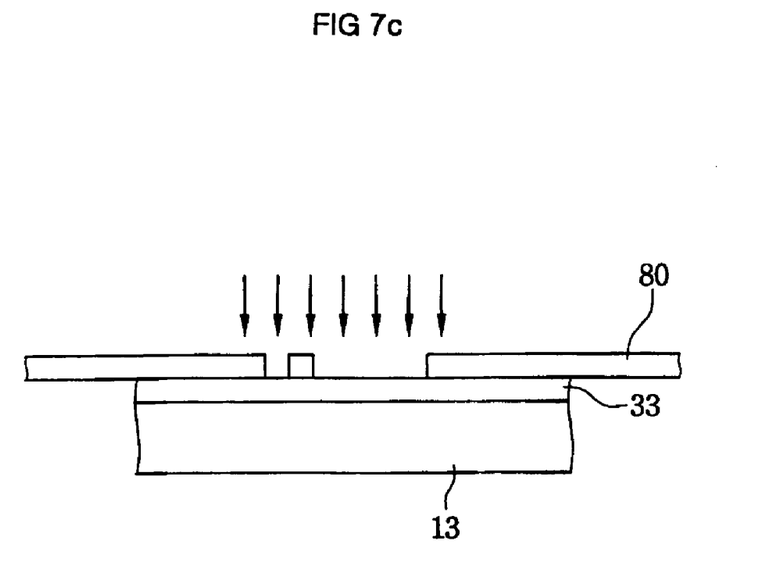
Figure 7D:
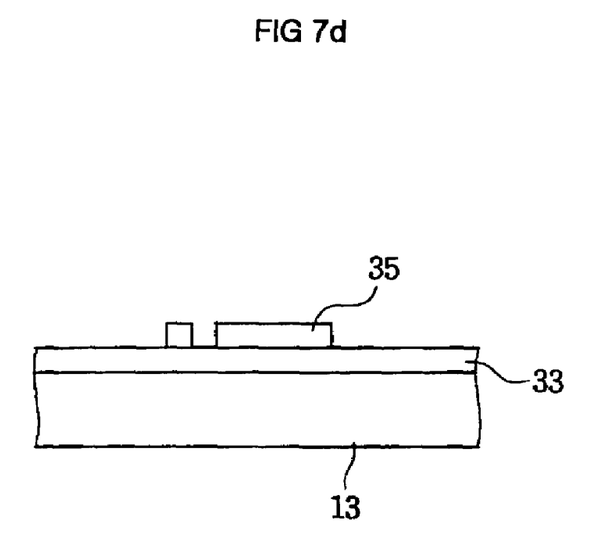

As illustrated in FIG. 7A, the center pad type chip 13, in which the ICs are formed in the active surface, is fabricated in the wafer level. Then, as illustrated in FIG. 7B, the buffer layer 33 made of an insulating material such as polyimide is formed on the active surface of chip 13 adjacent sides of the chip pads 14 of chip 13. As illustrated in FIG. 7C, a mask 80 is arranged on the buffer layer 33 and then a sputtering process is carried out thereon. The mask 80 is composed of a metal such as SUS or Molybdenum (MO). The jump metal lines 35 are formed as illustrated in FIG. 7D.

As described above, a center pad type chip with jumpers in accordance with an embodiment of the present invention can be simply manufactured by aligning the mask and then sputtering to form the metal lines, without the need for several photolithography processes. In the case of using a mask as described above, a bridge connecting the adjacent metal lines can be generated due to an extremely small space between the mask aligned on the chip and the active surface of the chip. The bridge can later be removed with an ion milling or ion etching process.

Figure 8A:
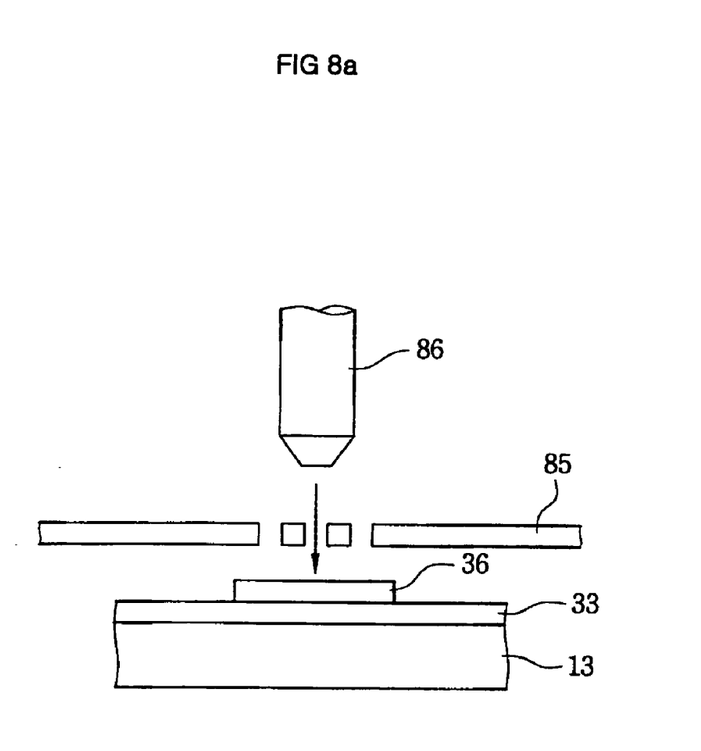
FIGS. 8A and 8B illustrates the laser-milling method employed in manufacturing a center pad type IC chip in accordance with an embodiment of the present invention.
Figure 8B:
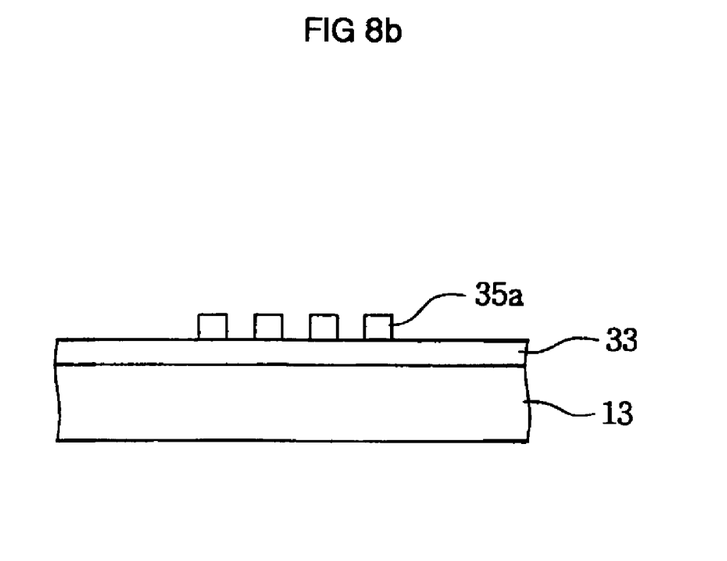

Alternatively, as illustrated in FIG. 8A, after forming the buffer layer 33 on the chip 13, a metal layer 36 is formed on the buffer layer 33. Next, a glass mask 85 is aligned on the metal layer 36 and then a milling process is carried out using a laser device. Then, as illustrated in FIG. 8B, jump metal lines 35a are obtained that are denser than jump metal lines 35 of FIG. 7D.

Next, a jumper formed at the chip state will be described below in reference to FIGS. 9 and 10.

Figure 9:
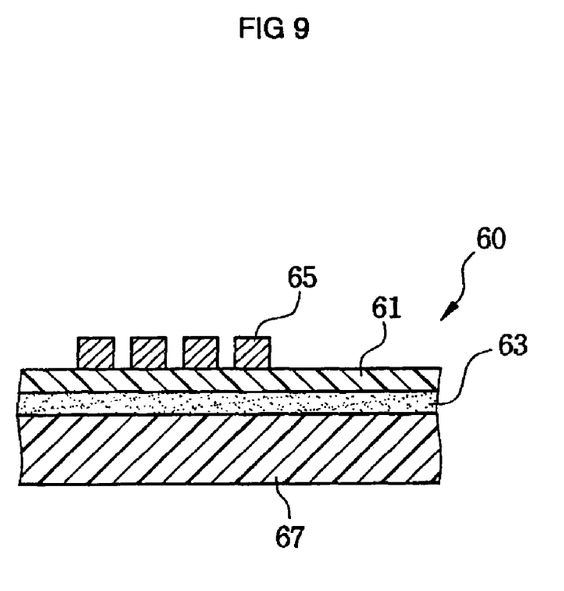
FIG. 9 is a cross sectional view of a jumper tape used in the present invention.

FIG. 9 is a cross sectional view of a jumper tape used as the jumper in the present invention. FIG. 10 is a cross sectional view of a multi chip package in accordance with another embodiment of the present invention, in which the jumper tape of FIG. 9 is employed as the jumper.

As illustrated in FIG. 9, a jumper tape 60 includes a base film 61, jump metal lines 65 on the base film 61 and an adhesive layer 63 for easily attaching the chip. The jump metal lines 65 are formed on one surface of the base film 61 by an electroplating or vapor deposition process of additive or semi additive type. The adhesive layer 63 is formed on the other surface of the base film 61. An adhesive or thermosetting resin can be used as the adhesive layer 63. A cover film 67 for easy handling may be attached to the other surface of the base film 61, opposite the surface on which the metal lines 65 are formed. As a simpler method, the jump metal line 65 can be formed by punching or stamping processes after forming metal layers, or by the bulk etching of thin film. Accordingly, the jump metal lines 65 can be mass-produced at low cost.

The problems caused by the long loop can be solved by attaching the jumper tape as shown in FIG. 9 to the center pad type chip using the conventional method of manufacturing the multi chip package. In other words, separate processes for forming the jumpers are not needed.

Figure 10:
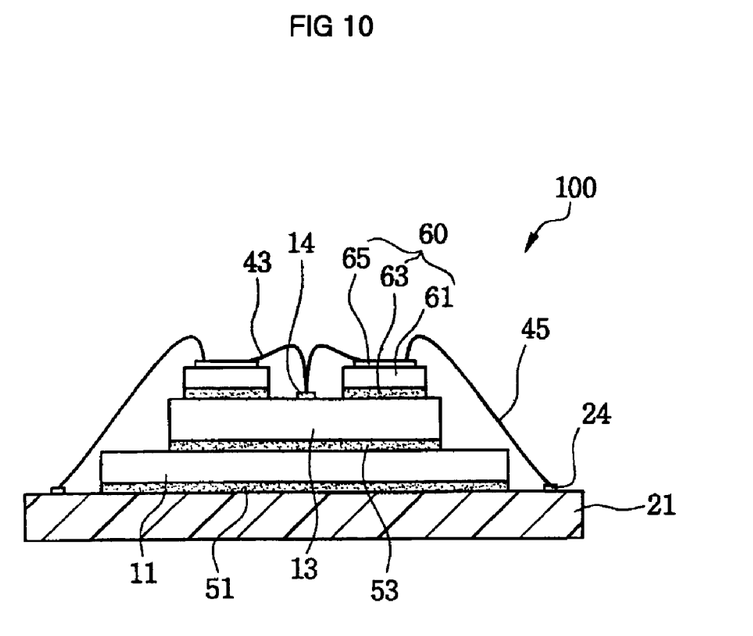
FIG. 10 is a cross sectional view of a multi chip package according to another embodiment of the present invention, in which the jumper tape of FIG. 9 is employed.

As shown in FIG. 10, in the multi chip package 100 with the jumper tape 60 of FIG. 9 forming the jumper, the jumper tape 60 is formed on the center pad type chip 13. The jump metal lines 65 are formed on one surface of the base film 61 of the jumper tape 60, and the adhesive layer 63 is formed on the other surface of the base film 61, opposite the surface on which the jump metal lines 65 are formed.

Since the jumper tape 60 is manufactured in a roll shape, the productivity increases and the manufacturing cost decreases. Furthermore, one type of jumper tape can be used for several types of chips regardless of the chip type, as long as the jump metal lines are disposed at the edge of the chip pads.

According to the present invention, since the bonding wires do not possess a long loop, the cutting, sagging, and short-circuiting of the bonding wires is prevented. Furthermore, since the jumpers are easily manufactured by aligning the mask and then sputtering without the complicated redistribution processes, the manufacturing cost is decreased. Since denser jump metal lines are easily formed by laser milling, the multi-photolithography etching process can be omitted. Moreover, since the jumpers are manufactured in a roll-tape shape, productivity increases while the manufacturing cost decreases. Furthermore, one type of jumper tape can be used in several types of chips regardless of the chip type.

The drawings and specification have disclosed typical preferred embodiments of present invention. Although specific terms are employed, they are used in a generic and descriptive sense only and not for purposes of limitation, the scope of this invention being set forth in the following claims.

What is claimed is:

1. A multi-chip package comprising:
   a board;
   an integrated circuit chip disposed over the board, the integrated circuit chip having chip pads disposed on a center region of the integrated circuit chip;
   a buffer layer arranged adjacent to a side of the chip pads, a bottom surface of the buffer layer in contact with an adhesive layer;
   jump metal lines disposed on a top surface of the buffer layer, the jump metal lines spaced apart from each other, each of the jump metal lines having a first planar surface and a second planar surface that is opposite the first planar surface, the first planar surface in contact with the top surface of the buffer layer;
   a first bonding wire connecting one of the jump metal lines to a corresponding chip pad; and
   a second bonding wire connecting the one of the jump metal lines to a corresponding board pad of the board.

2. The multi-chip package of claim 1, wherein one end of each of the jump metal lines is adjacent to the chip pads and the other end is adjacent to an edge of the chip.

3. The multi-chip package of claim 1, wherein the buffer layer comprises a base film.

4. The multi-chip package of claim 3, wherein the adhesive layer comprises a thermosetting resin for attaching the buffer layer to a surface of the chip.

5. The multi-chip package of claim 1, wherein the jump metal lines are selected from the group consisting of gold (Au), aluminum (Al) and palladium (Pd).

6. The multi-chip package of claim 1, the chip pads arranged on a surface of the integrated circuit chip, the adhesive layer disposed in contact with the surface of the integrated circuit chip.

7. The multi-chip package of claim 1, the adhesive layer comprising an insulating material.

8. The multi-chip package of claim 7, the insulating material comprising polyimide.

9. The multi-chip package of claim 1, further comprising another integrated circuit chip bonded to the integrated circuit chip by another adhesive layer.

10. The multi-chip package of claim 1, wherein the the integrated circuit chip is between the board and the buffer layer.

11. The multi-chip package of claim 10, the chip pads disposed on a top surface of the integrated circuit chip.

12. A multi chip package comprising:
   a board having a chip mounting area at the center region thereof and board pads at four sides thereof;
   a first chip mounted over the chip mounting area, the first chip having chip pads at opposite sides thereof;
   a second chip mounted over the first chip, the second chip having chip pads at substantially the center region thereof;
   a jumper including buffer layers over the second chip, the buffer layers arranged adjacent opposite sides of the chip pads of the second chip;
   a plurality of jump metal lines formed on the buffer layers spaced apart from each other; first bonding wires connecting the chip pads of the first chip to the board pads;
   second bonding wires connecting the chip pads of the second chip to the jump metal lines; and
   jump bonding wires connecting the jump metal lines to the board pads.

13. The multi chip package of claim 12, wherein one end of the jump metal lines is adjacent to the chip pads of the second chip and the other end is adjacent to the edge of the second chip.

14. A multi-chip package comprising:
   a board, the board including board pads arranged on a surface of the board;
   a first integrated circuit chip bonded to the surface of the board by a first adhesive layer, the first integrated circuit chip including first chip pads arranged on a surface of the first integrated circuit chip;
   a second, integrated circuit chip bonded to the surface of the first integrated circuit chip by a second adhesive layer, the second integrated circuit chip including second chip pads arranged on a surface of the second integrated circuit chip;
   a buffer layer arranged on the surface of the second integrated circuit chip and adjacent to a side of the second chip pads; and
   jump metal lines arranged on the buffer layer, each jump metal line physically isolated from the other jump metal lines, a surface of the jump metal lines in contact with a surface of the buffer layer.

15. The multi-chip package of claim 14, a length of the buffer layer less than a length of the second integrated circuit chip, a width of the buffer layer less than a width of the second integrated circuit chip, the length of the buffer layer greater than the width of the buffer layer.

16. The multi-chip package of claim 15, a length of the jump metal lines less than a width of the buffer layer, the length of the jump metal lines greater than the width of the jump metal lines.

17. The multi-chip package of claim 14, further comprising:
- a first bonding wire connecting one of the jump metal lines to one of the board pads; and
- a second bonding wire connecting the one of the jump metal lines to one of the second chip pads.

18. The multi-chip package of claim 17, further comprising a third bonding wire connecting one of the first chip pads to one of the board pads.

19. The multi-chip package of claim 14, the buffer layer bonded to the surface of the second semiconductor chip by a third adhesive layer, the surface of the second semiconductor chip comprising an upper surface of the second semiconductor chip.

20. The multi-chip package of claim 19, the third adhesive layer comprising an insulating material.

* * * * *

UNITED STATES PATENT AND TRADEMARK OFFICE
CERTIFICATE OF CORRECTION

PATENT NO. : 7,224,055 B2 Page 1 of 1
APPLICATION NO. : 10/269328
DATED : May 29, 2007
INVENTOR(S) : Gu-Sung Kim et al.

It is certified that error appears in the above-identified patent and that said Letters Patent is hereby corrected as shown below:

Column 6, line 12, claim 10 the words "the the" should read -- the --.

Signed and Sealed this

Fifth Day of August, 2008

JON W. DUDAS
*Director of the United States Patent and Trademark Office*